United States Patent
Wong et al.

(10) Patent No.: US 12,506,050 B1
(45) Date of Patent: Dec. 23, 2025

(54) FACE BONDED SEMICONDUCTOR DEVICE WITH THROUGH OXIDE VIA AND METAL PLUG

(71) Applicant: GlobalFoundries Singapore Pte. Ltd., Singapore (SG)

(72) Inventors: Qiying Wong, Singapore (SG); Wanbing Yi, Singapore (SG); Yudi Setiawan, Singapore (SG); Vel Murugan Nagalinggam, Johor Bahru (MY); Kemao Lin, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/939,075

(22) Filed: Nov. 6, 2024

(51) Int. Cl.
| H01L 23/48 | (2006.01) |
| H01L 21/768 | (2006.01) |
| H01L 23/00 | (2006.01) |
| H01L 25/065 | (2023.01) |
| H01L 23/532 | (2006.01) |

(52) U.S. Cl.
CPC ...... H01L 23/481 (2013.01); H01L 21/76877 (2013.01); H01L 24/08 (2013.01); H01L 25/0657 (2013.01); H01L 23/53214 (2013.01); H01L 23/53261 (2013.01); H01L 24/80 (2013.01); H01L 2224/08145 (2013.01); H01L 2224/80895 (2013.01); H01L 2224/80896 (2013.01); H01L 2225/06541 (2013.01); H01L 2225/06565 (2013.01)

(58) Field of Classification Search
CPC ............... H01L 25/0657; H01L 23/481; H01L 21/76877; H01L 24/08
See application file for complete search history.

(56) References Cited

U.S. PATENT DOCUMENTS

| 6,921,961 | B2 | 7/2005 | Sanchez et al. |
| 9,881,904 | B2 | 1/2018 | Das et al. |
| 10,306,760 | B2 | 5/2019 | Li et al. |
| 11,978,758 | B2 | 5/2024 | Chen et al. |
| 2012/0292777 | A1 | 11/2012 | Lotz |
| 2023/0275024 | A1* | 8/2023 | Chin .................... H01L 23/585 |
| 2024/0429128 | A1* | 12/2024 | Dutta ................ H01L 21/76898 |

FOREIGN PATENT DOCUMENTS

EP 3407376 A1 4/2020

* cited by examiner

*Primary Examiner* — Suberr L Chi

(57) ABSTRACT

A bonded semiconductor device includes a first semiconductor device, a second semiconductor device face bonded to the first semiconductor device, at least one metal plug in a middle of line layer of the first semiconductor device, and a through oxide via (TOV) coupled to the at least one metal plug and a metal line in a backside region of the first semiconductor device.

20 Claims, 6 Drawing Sheets

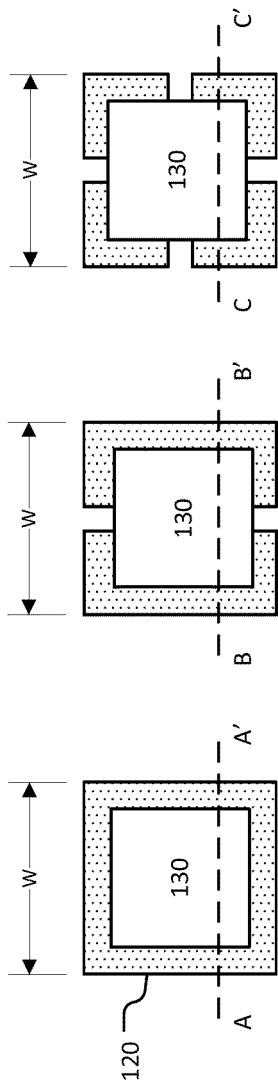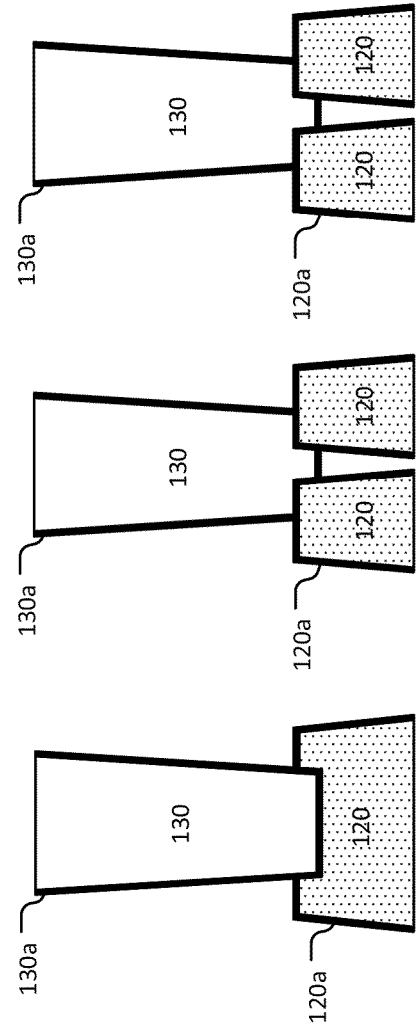

FACE BONDED SEMICONDUCTOR DEVICE WITH THROUGH OXIDE VIA AND METAL PLUG

BACKGROUND

The semiconductor industry continues to improve the integration density of electronic components by various techniques, including reducing the minimum feature size of devices and using devices with vertical orientations. Another technique is to bond two stacked devices to one another to form a three-dimensional integrated circuit (3DIC). 3DICs can be formed by bonding a wafer to another wafer, bonding a die to a wafer, or bonding a die to another die. 3DIC bonding can be performed by fusing metal bumps on the bonding surfaces as an interconnect scheme, or by hybrid bonding in which opposing substrate surfaces are placed against one another and heated so that both dielectric-to-dielectric and direct metal-to-metal bonds are formed between the two surfaces.

Face bonded semiconductor devices present several manufacturing and performance challenges. Because the active faces of the devices are bonded together, vias for data and power interface to external structures, for example through oxide vias (TOV) and through silicon vias (TSV) are formed through substrate layers of the devices. In some cases, these vias interface with structures around the active layers. It is difficult to form vias that accurately land on target structures within face bonded devices, especially as integration density continues to increase.

SUMMARY

Embodiments of the present application relate to a face bonded semiconductor device with a metal plug and a method for forming a face bonded semiconductor device.

In an embodiment, a bonded semiconductor device includes a first semiconductor device, a second semiconductor device bonded to the first semiconductor device, at least one metal plug in a middle of line layer of the first semiconductor device, and a through oxide via (TOV) coupled to the at least one metal plug and a metal line in a backside region of the first semiconductor device.

In an embodiment, a three dimensional integrated circuit (3DIC) includes a first semiconductor device, a second semiconductor device bonded to the first semiconductor device, at least one metal plug in a middle of line layer of the first semiconductor device, and a TOV comprising a first end coupled to the at least one metal plug and a second end coupled to a metal line in a backside region of the first semiconductor device.

In an embodiment, a method for forming a semiconductor device includes forming at least one metal plug in a middle of line layer of a first semiconductor device, face bonding the first semiconductor device to a second semiconductor device, forming a TOV at a backside surface of the first semiconductor device, wherein the TOV lands on the at least one metal plug, and forming a metal line coupled to the TOV on the backside surface of the first semiconductor device.

BRIEF DESCRIPTION OF THE DRAWINGS

FIGS. 3A, 3B and 3C illustrate top views of three different embodiments of a TOV and metal plugs.

FIGS. 4A, 4B and 4C illustrate cross-sectional views taken along lines A-A', B-B', and C-C' of FIGS. 3A, 3B and 3C respectively.

DETAILED DESCRIPTION

Embodiments of the present disclosure relate to a face bonded semiconductor device with a through oxide via coupled to a metal plug. In particular, embodiments relate to a semiconductor device with two face bonded semiconductor devices and a through oxide via that contacts a metal plug within a middle of line layer of the device.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured. The figures are not drawn to scale, and features may be enlarged or diminished for visual clarity.

The present disclosure relates to a bonded semiconductor device 100 comprising at least one through oxide via (TOV). As the name implies, a TOV passes through an oxide layer of a semiconductor device. In embodiments of the present disclosure, a TOV 130 passes through a backside oxide layer without extending through any bulk semiconductor (e.g. silicon) layers of a bonded device. In contrast, a conventional through silicon via (TSV) passes through one or more bulk semiconductor layer.

Figure 1:
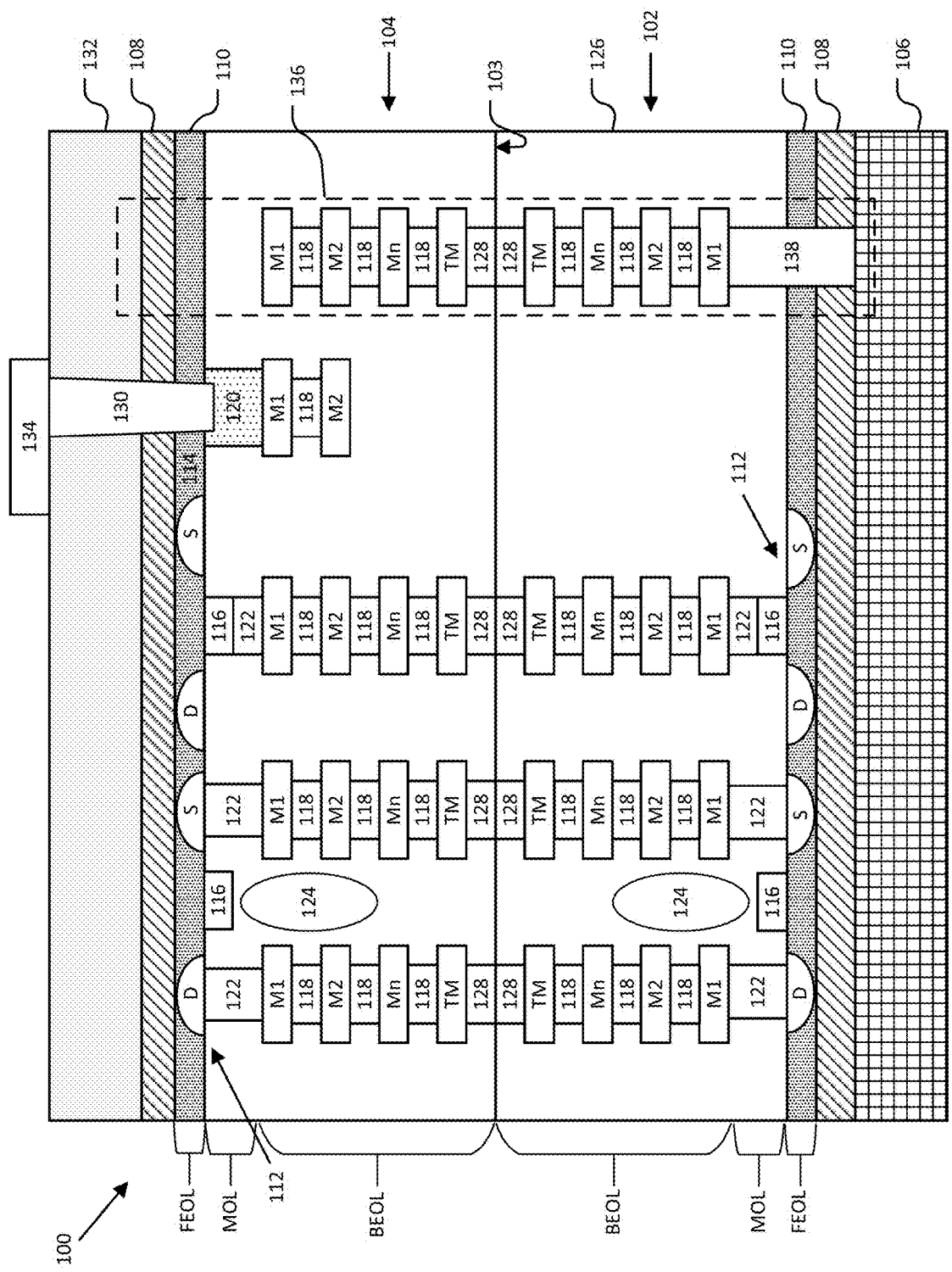
FIG. 1 illustrates a first embodiment of a face-bonded semiconductor device with a metal plug coupled to a through oxide via.

FIG. 1 illustrates an embodiment of a semiconductor device 100 with a lower semiconductor device 102 face bonded to an upper semiconductor device 104 (hereinafter, "device 102" and "device 104"). The semiconductor device may be a three-dimensional integrated circuit (3DIC), and may comprise additional devices beyond the lower and upper devices 102 and 104. The circuit may comprise various circuitry for power, radio frequency (RF) communications, memory, processing, optical detection, etc.

In the embodiment of FIG. 1, each of the lower and upper device 102 and 104 is a silicon on insulator (SOI) substrate. The lower device 102 includes a bulk semiconductor layer 106, a buried oxide (BOX) layer 108, and a device layer 110. Although no bulk substrate 106 is shown in the upper device 104 of FIG. 1, a small amount of semiconductor material may be present in some embodiments.

The semiconductor substrates are not limited to being SOI substrates. One or both of the substrates may be another type such as a silicon germanium substrate, a gallium nitride substrate, a silicon substrate, or another substrate material as known in the art. In addition, the upper and lower devices 102 and 104 may have different semiconductor materials from one another. For example, in another embodiment, the lower device 102 has a silicon germanium substrate and the upper device 104 has a SOI substrate. Other variations are possible, including using bulk or layered semiconductor substrates.

The SOI substrates of FIG. 1 include active regions 112 on which active devices are present. The active region 112 may include active components or circuits, such as conductive features, implantation regions, resistors, capacitors, and other semiconductor elements, e.g., transistors, diodes, etc. that are formed using front-end-of-line (FEOL) processes.

The active devices shown in FIG. 1 are transistors with gates 116 coupled to a source region S and a drain region D on opposite sides of the gate. In some embodiments, the source and drain regions S and D of adjacent transistors are isolated from one another by a shallow trench isolation (STI) material 114 in the same device layer 110 as the implant regions for the source and drain. The STI material 114 may be an insulating material such as silicon oxide.

The gates 116 may be conventional gates as known in the art, e.g. polysilicon gates separated from the source and drain regions by a gate dielectric material. In some applications, the transistors may be used for power amplifiers and operate at voltages of up to 5V, 10V or more. In other embodiments, the gates 116 may be logic gates or switches for an RF device, for example. The gates 116 may include one or more known gate material such as polysilicon or silicide, or a metal or metal composite such as tungsten, tungsten nitride, titanium nitride, etc. The embodiment of FIG. 1 shows air gaps 124 over the gates 116, which may be present in some RF devices.

Also shown in FIG. 1 are metal lines of metal layers M1-Mn and a top metal layer TM, each corresponding to a back end of line (BEOL) metal layer. Each of the metal lines of metal layers M1-TM may be coupled to a vertically adjacent metal line by a via 118, which may be interlayer dielectric vias (IDV) or interconnect vias (IV). Vias 118 are formed by etching via holes using conventional mask patterning and etch processes as known in the art and depositing a conductive material in the via holes. The metal lines and vias 118 may include conductive materials typically used in BEOL processes, such as copper, aluminum, tungsten, titanium, titanium nitride, tantalum, tantalum nitride, or multiple layers or combinations thereof. The metal lines M1-Mn, metal structures in top metal TM, and vias 118 may be lined with a liner material (not shown). The liner material may promote adhesion and deposition and prevent migration of certain metal materials as known in the art.

Conductive structures in the devices are surrounded by an insulating material 126 which is a dielectric material. In some embodiments, the insulating material 126 is made of silicon oxide, although other materials are possible. In some embodiments, the insulating material 126 includes multiple dielectric layers of dielectric materials. One or more of the multiple dielectric layers may be made of low dielectric constant (low-k) materials.

Conductive structures of the two devices 102 and 104 are electrically coupled to one another by metal bond pads 128 located at the interface 103 between the devices. The bond pads 128 are contact pads on the faces of the devices, and may be coupled to one another by a hybrid bonding process, for example. The metal of bond pads 128 may be copper, aluminum, or other metal materials appropriate for hybrid bonding as known in the art. In an embodiment, one or more of the bond pads 128 may be a bonding via to make a direct device-to-device metal connection. The bond pads 128 may be lined with a barrier liner as known in the art. Examples of barrier materials that may be used for the barrier liner are nitride materials such as titanium nitride and tantalum nitride. Devices 102 and 104 may be face-bonded to one another using known processes such as hybrid bonding, for example.

Each of the devices 102 and 104 may be generally divided between a FEOL portion, a middle of line (MOL) portion and a BEOL portion as illustrated with respect to the lower device 102 of FIG. 1. Active structures in active region 112 are formed using FEOL processes in a FEOL portion of the device, metal wiring and interconnect structures are generally formed using BEOL processes in a BEOL portion of the device, and interconnect structures connecting BEOL structures to FEOL structures are located in the MOL portion. Accordingly, the MOL portions of the devices are located between the active region 112 and the first metal layer M1.

The interconnect structures shown in the MOL portion of the embodiment of FIG. 1 are contacts 122 and metal plug 120. The contacts 122 and metal plug 120 may be formed of known contact materials. For example, the contacts 122 and metal plug 120 may include a tungsten material and a titanium nitride barrier liner layer (120a in FIGS. 4A-4C) along the sidewalls and bottoms of the contacts and plug. Other materials and combinations of materials are possible as known in the art.

The metal plug 120 is coupled to a through oxide via (TOV) 130. The TOV 130 may comprise a metal material such as tungsten or copper, for example. In a specific embodiment, the TOV 130 comprises a copper conductive material with a titanium nitride barrier liner (130a in FIGS. 4A-4C).

As seen in the figure, the TOV 130 may be recessed into the metal plug 120 such that portions of sidewalls at a first terminal end of the TOV 130 are in direct physical contact with the metal material of metal plug 120. The additional surface area provided by contact between the sidewalls of the TOV 130 and the metal plug 120 reduce contact resistance compared to a TOV 130 that lands on a face of the metal plug 120.

The metal plug 120 may be coupled to BEOL interconnect layers including metal layer M1. The simplified illustration in FIG. 1 only shows two metal layers directly coupled to the metal plug 120, but the metal plug 120 may be coupled to any number of the metal layers through metal wiring in the BEOL portions of the lower and upper devices 102 and 104. In an embodiment, the TOV 130 and metal plug 120 provide power to the device 100. In other embodiments, the TOV 130 and metal plug 120 may provide information or timing signals.

The TOV 130 extends through a backside insulation layer 132 on the backside of the upper device 104. The backside insulation layer 132 may be a silicon oxide material such as tetraethyl orthosilicate (TEOS). A second terminal end of the TOV 130 may be coupled to a backside metal line 134 on the backside of the upper device 104. The metal of backside metal line 134 may be aluminum or copper for example. In a specific embodiment, the metal line 134 is an aluminum line that is part of the power wiring of the device 100. The metal line 134 may be coupled to external structures through a solder bump (not shown) or similar structure as known in the art.

The TOV 130 and metal plug 120 are located at an edge region of the device 100 between a crack stop region 136 and the active structures within the device. The TOV 130 and metal plug 120 may be adjacent to the crack stop region 136. That is, TOV 130 and metal plug 120 may be located next to the crack stop region 136 without any active structures of active region 112 in between.

The crack stop region 136 is located at edges of the device and may comprise structures which prevent cracks that can form in the dicing process from propagating into the device 100. The crack stop region 136 in FIG. 1 is formed of metal structures that can be deposited at the same time as metal lines and interconnects elsewhere in the device, and a metal plug 138, e.g. a W plug, is located at terminal end of the crack stop region 136 and extends through the device layer 110 and the BOX layer 108 of lower device 102. Other embodiments of structures in a crack stop region 136 are possible as known in the art. Metal structures in the crack stop region 136 may be electrically isolated from active structures within the device 100.

FIGS. 2A to 2F illustrate an example of a method for forming the device 100 of FIG. 1.

Figure 2A:
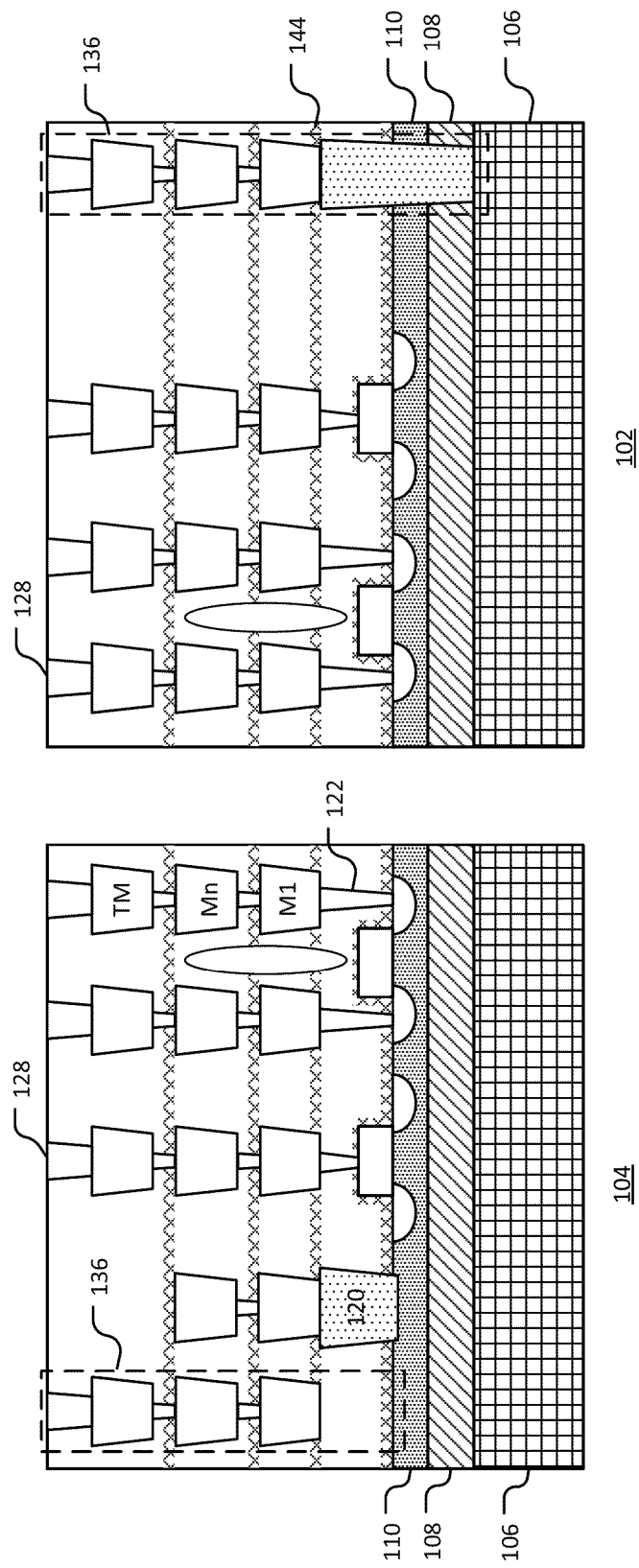
FIGS. 2A to 2F illustrate an example of a method for forming the face-bonded semiconductor device of FIG. 1
Figure 2C:
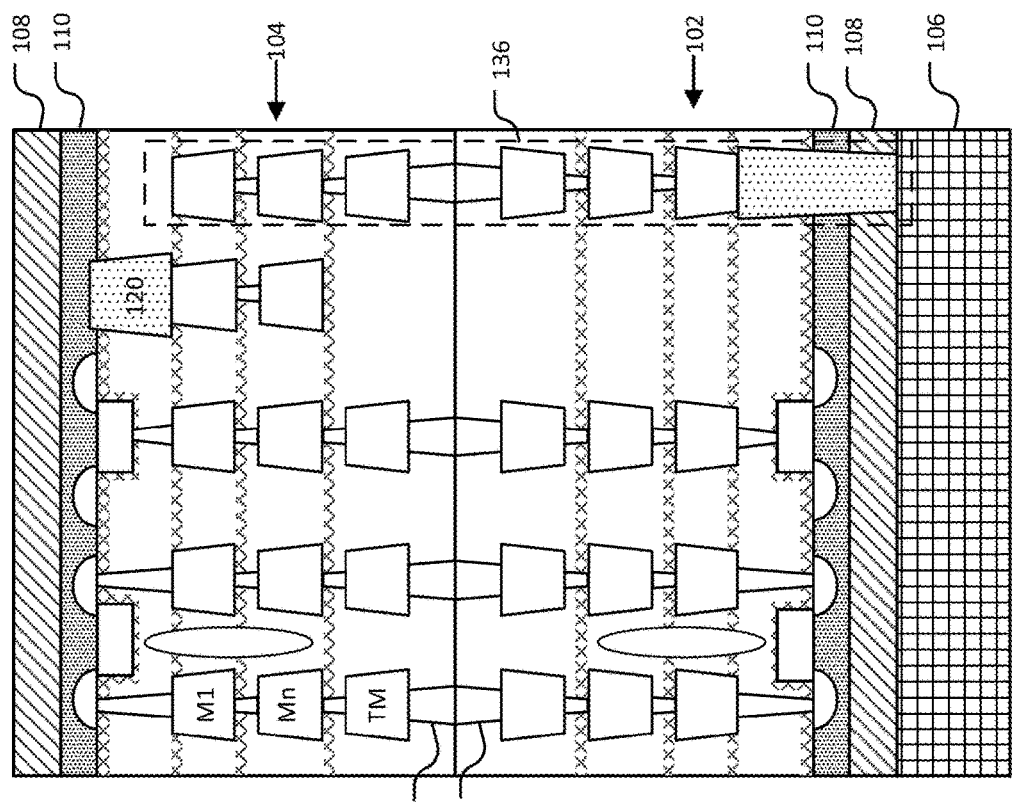

The two semiconductor devices 102 and 104 in FIG. 2A may be formed separately using implant, deposition, etch and planarization processes. The metal plug 120 may be formed in an isolated region of the wafer of upper device 104 that is separate from active structures, e.g. in an edge region adjacent to a crack stop region 136, at the same time as contacts 122 in a MOL process. In some embodiments, the metal plug 120 may be recessed into device layer 110. Although only three metal layers are shown in the simplified cross-sectional view of FIG. 2A, it should be understood that multiple metal layers, represented as Mn, may be present between bottom metal layer M1 and top metal layer TM. Also shown in FIG. 2A are a plurality of layers 144, which may be etch stop or liner materials, for example. The layers 144 may comprise one or more of a nitride or carbide material, for example.

Figure 2B:
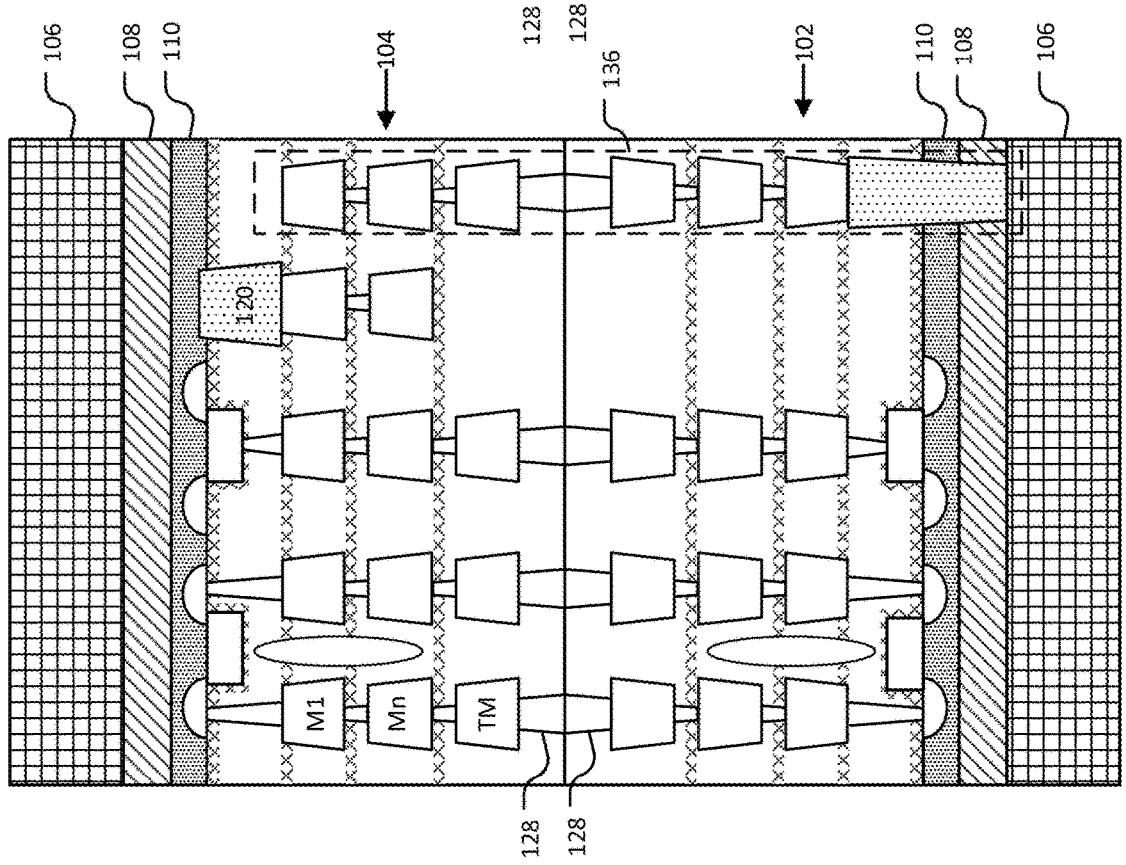

After the devices are formed, as seen in FIG. 2B, a wafer comprising the upper device 104 is flipped and face bonded to a wafer comprising the lower device 102. The face bonding may be performed using a face bonding process known in the art including hybrid bonding. In another embodiment, the upper device 104 may be a die that is face bonded to a wafer comprising the lower device 102. The face bonding process provides electrical coupling between bond pads 128 of the lower device 102 with bond pads 128 of the upper device 104.

Following face bonding, bulk substrate material 106 is removed from the upper device 104 using one or more removal process such as backgrinding and reactive ion etching (RIE). In the embodiment shown in FIG. 2C, the entire bulk substrate material 106 is removed from the backside of upper device 104, exposing BOX layer 108.

Figure 2E:
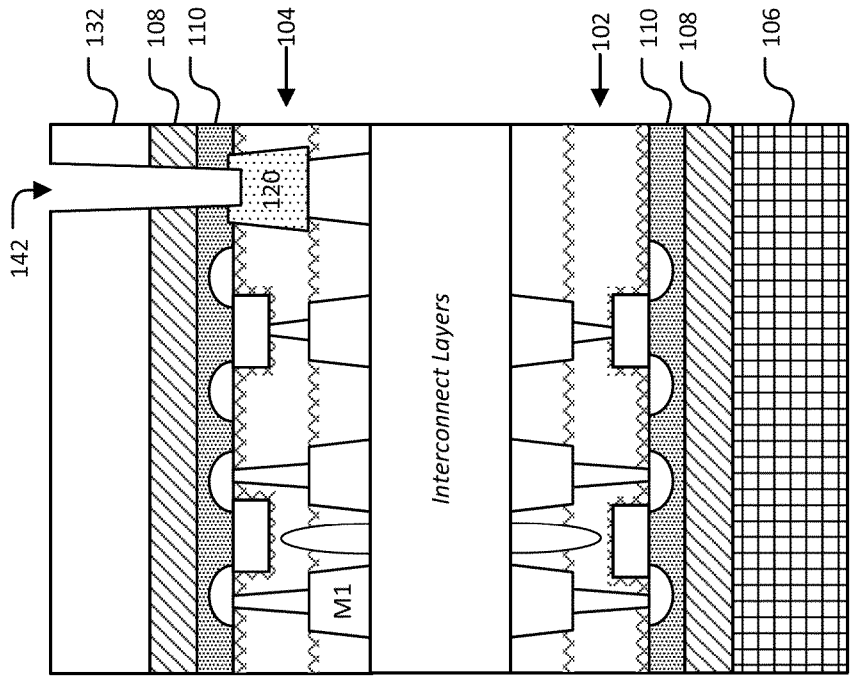
Figure 2D:
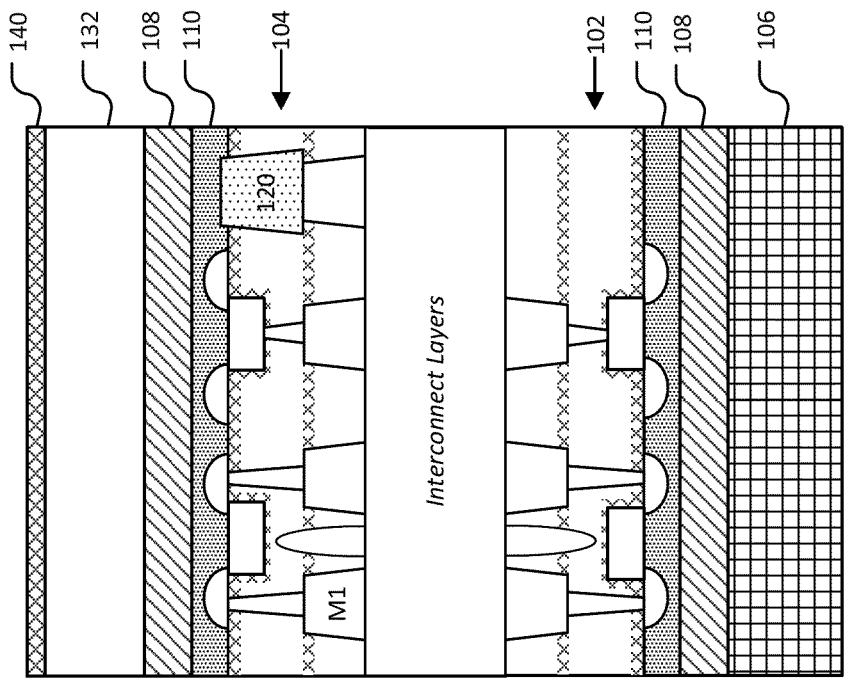

In FIG. 2D and the following figures, interconnect layers including bond pads 128 and metal layers Mn-TM, as well as crack stop region 136, are omitted for visual clarity. As seen in FIG. 2D, a backside insulation layer 132, e.g. a TEOS layer, is deposited over the exposed backside surface of upper device 104. A leveling process such as chemical mechanical polishing (CMP) may be performed to planarize the backside insulation layer 132. Subsequently, a hard mask layer 140 is deposited over the backside insulation layer 132. The hard mask layer 140 may be a nitride material such as silicon nitride.

A photoresist pattern (not shown) may be deposited over the hard mask layer 140 and used as an etch mask to create an opening 142 through backside insulation layer 132, BOX layer 108 and device layer 110. In some embodiments, the opening 142 may extend into the metal plug 120 to land on a recessed surface of the metal plug 120 instead of landing on a planar surface of the metal plug 120. After forming the opening 142, hard mask 140 is removed by one or more processes such as RIE or CMP. The resulting structure with opening 142 is shown in FIG. 2E.

Figure 2F:
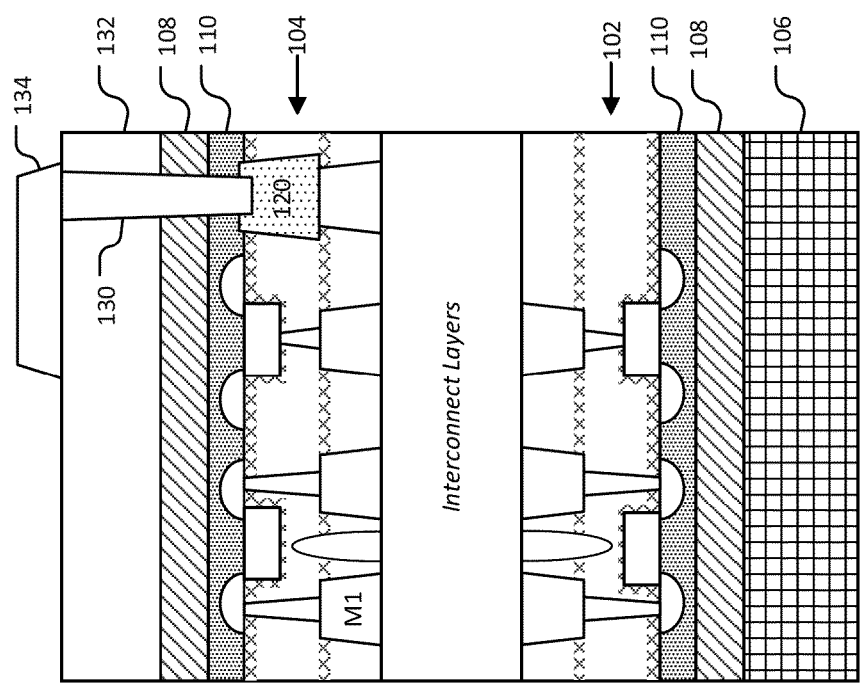

A liner material such as titanium nitride (not shown) and a metal material, e.g. copper, may be deposited into opening 142 to form TOV 130. Residual metal material may be removed from the backside surface by a planarization process. One or more metal structures including backside metal line 134, which is electrically coupled to metal plug 120, are formed on a backside of upper device 104 using a combination of deposition and etching processes as known in the art. For example, the backside metal line 134 may be formed by depositing a layer of metal (e.g. aluminum) on the backside surface of backside insulation layer 132, forming a photoresist layer over the metal, and etching the layer of metal. The resulting structure is shown in FIG. 2F. Additional wiring may be formed at this step along with the backside metal line 134 shown in the figure. The backside metal line 134 is in a backside portion of the upper device 104, e.g. a portion of the device which is on the opposite side of the active region 112 to the BEOL region. The FEOL region and BEOL region are on a frontside of a device, and backside metal line 134 is on the backside of the device.

FIGS. 3A, 3B and 3C illustrate top views of three different embodiments of a TOV 130 and metal plugs 120. FIGS. 4A, 4B and 4C illustrate cross-sectional views taken along lines A-A', B-B', and C-C' of FIGS. 3A, 3B and 3C respectively. In the embodiments of FIGS. 3B, 3C, 4B and 4C, the device 100 comprises a plurality of metal plugs 120 that are coupled to a single TOV 130.

FIGS. 3A and 4A show a first embodiment in which the metal plug 120 is a monolithic structure. The shape of the metal plug 120 is not particularly limited. The metal plug 120 may have a rectilinear shape as seen in the figures, a circular shape, an oval shape, etc. Also shown in FIGS. 4A, 4B and 4C are liner layers 130a for TOVs 130 and liner layers 120a for metal plugs 120.

In FIGS. 3A and 4A, the width "W" of metal plug 120 at the interface with TOV 130 is greater than the width of TOV 130. The greater width of metal plug 120 provides a larger process margin for forming the TOV 130 within the area of the metal plug 120. The tip or terminal end of TOV 130 is buried within metal plug 120 so that sidewalls of the terminal end of TOV 130 contact with the metal plug 120.

Similar relationships are present in the embodiments of FIGS. 3B, 3C, 4B and 4C in which a plurality of metal plugs 120 are coupled to a TOV 130. In these embodiments, the width "W" spanned by the plurality of metal plugs 120 is greater than the width of the TOV 130 at the interface between the metal plugs 120 and the TOV 130.

In some embodiments, the width "W" spanned by the at least one metal plug 120 is from 0.5 microns to 1.0 microns, and the width of the TOV 130 is from 0.4 microns to 0.9 microns. These widths may be widths at an overlapping portion of the at least one metal plug 120 and the TOV 130. These dimensions are not limiting, and other embodiments are possible.

FIGS. 3B and 4B show a second embodiment in which two linear or bar-shaped metal plugs 120 are arranged in parallel to one another and are both in contact with the same TOV 130. The TOV 130 contacts a face (e.g. the upper face in the figures) and at least one sidewall of each of the two bar-shaped metal plugs 120. The second embodiment may provide a larger contact area between TOV 130 and metal plugs 120 compared to the first embodiment since the TOV 130 interfaces with sidewalls of both bar-shaped metal plugs 120. In various embodiments, a device 100 may comprise at least two adjacent bar-shaped metal plugs 120. The at least two bar-shaped metal plugs 120 may include three, four, or five bar-shaped metal plugs 120, for example.

In some embodiments, the device 100 may include at least one metal plug 120 comprising an array of four or more metal plugs 120 spaced apart from one another as seen in the third embodiment of FIGS. 3C and 4C. While FIG. 3C shows an array of four metal plugs 120, other embodiments may have a larger number of metal plugs, e.g. nine metal plugs 120 or sixteen metal plugs 120. An array of metal plugs 120 may comprise an equal number of plugs in each dimension, e.g. an array of 3×3 metal plugs or 4×4 metal plugs, but embodiments are not limited to such arrangements. As a practical matter, the number of metal plugs 120 in an array may be limited by the deposition and etch technologies used to form the device 100.

The etch process (as illustrated in FIG. 2E) used to form the TOV 130 in the first embodiment may be different from the etch process used to form the second embodiment. For example, the first embodiment may use an etch chemistry selective to the metal (e.g. tungsten, molybdenum, etc.) of metal plug 120 to create the central recess in the metal plug, while the second embodiment may use an etch chemistry selective to the insulating material 126 to minimize the extent to which the metal of metal plugs 120 is removed. In another example, the first embodiment may be formed using a laser etch process, while the second embodiment may be formed using a liquid or plasma etch process. Various embodiments are possible using etch techniques and chemistries known in the art to realize the structures shown in FIGS. 4A to 4C.

Embodiments of the present disclosure have numerous advantages over conventional processes. Conventionally, a TOV is formed to land directly on a BEOL metal line, which presents a risk of punch-through or gaps. The one or more metal plug 120 of the present disclosure can reduce this risk by creating a vertical buffer between the metal line and the TOV using MOL processes which are generally more accurate than backside processes. Accordingly, embodiments may increase the processing margins for forming a device 100. In addition, side surfaces of the TOV 130 may contact side surfaces of one or more metal plug 120, which can reduce the resistance of the interface between the TOV 130 and the one or more metal plug 120. These and other advantages will be apparent to persons of skill in the art.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A bonded semiconductor device comprising:
a first semiconductor device;
a second semiconductor device face bonded to the first semiconductor device;
at least one metal plug in a middle of line layer of the first semiconductor device; and
a through oxide via (TOV) that physically contacts the at least one metal plug and is coupled to a metal line located in a backside region of the first semiconductor device.

2. The bonded semiconductor device of claim 1, wherein sides of the at least one metal plug contact sides of the TOV.

3. The bonded semiconductor device of claim 1, wherein the at least one metal plug comprises at least two adjacent bar-shaped metal plugs.

4. The bonded semiconductor device of claim 3, wherein the TOV contacts a face and at least one sidewall of each of the two bar-shaped metal plugs.

5. The bonded semiconductor device of claim 1, wherein a first end of the at least one metal plug is coupled to the TOV, and a second end of the at least one metal plug is coupled to a metal structure in metal layer M1.

6. The bonded semiconductor device of claim 1, wherein the at least one metal plug comprises an array of four or more metal plugs spaced apart from one another.

7. The bonded semiconductor device of claim 1, wherein the at least one metal plug comprises a tungsten material.

8. The bonded semiconductor device of claim 1, wherein the metal line comprises an aluminum material.

9. The bonded semiconductor device of claim 1, wherein the TOV extends through a backside insulation layer and a device layer of the first semiconductor device.

10. The bonded semiconductor device of claim 1, wherein the at least one metal plug is a single metal plug and the TOV is recessed into the single metal plug.

11. The bonded semiconductor device of claim 1, wherein the at least one metal plug and the TOV are laterally adjacent to a crack stop region and between the crack stop region and active structures of the first semiconductor device.

12. The bonded semiconductor device of claim 1, wherein the at least one metal plug spans a width that is greater than a width of the TOV at an interface between the at least one metal plug and the TOV.

13. The bonded semiconductor device of claim 12, wherein the width spanned by the at least one metal plug is from 0.5 microns to 1.0 microns, and the width of the TOV is from 0.4 microns to 0.9 microns.

14. The bonded semiconductor device of claim 1, wherein the at least one metal plug comprises a plurality of metal plugs.

15. A three-dimensional integrated circuit (3DIC) comprising:
a first semiconductor device;
a second semiconductor device face bonded to the first semiconductor device;
at least one metal plug in a middle of line layer of the first semiconductor device; and
a through oxide via (TOV) comprising a first end that physically contacts the at least one metal plug and is coupled to a second end coupled to a metal line located in a backside region of the first semiconductor device.

16. The 3DIC of claim 15, wherein the at least one metal plug comprises a plurality of metal plugs.

17. The 3DIC of claim 16, wherein the at least one metal plug comprises at least two adjacent bar-shaped metal plugs.

18. The 3DIC of claim 15, wherein the at least one metal plug comprises an array of four or more metal plugs spaced apart from one another.

19. The 3DIC of claim 15, wherein the at least one metal plug spans a width that is greater than a width of the TOV at an interface between the at least one metal plug and the TOV.

20. A three-dimensional integrated circuit (3DIC) comprising:
a first semiconductor device;
a second semiconductor device face bonded to the first semiconductor device;
at least one metal plug in a middle of line layer of the first semiconductor device; and a through oxide via (TOV) comprising a first end coupled to the at least one metal plug and a second end coupled to a metal line in a backside region of the first semiconductor device,
wherein sides of the at least one metal plug physically contact sides of the TOV.

\* \* \* \* \*